United States Patent [19]
Liao

[11] Patent Number: 6,020,606
[45] Date of Patent: Feb. 1, 2000

[54] STRUCTURE OF A MEMORY CELL

[75] Inventor: Kuan-Yang Liao, Taipei City, Taiwan

[73] Assignee: United Silicon Incorporated, Taiwan

[21] Appl. No.: 09/107,159

[22] Filed: Jun. 9, 1998

[30] Foreign Application Priority Data

Mar. 20, 1998 [TW] Taiwan ................................. 87104159

[51] Int. Cl.[7] .................................................. H01L 29/76
[52] U.S. Cl. ......................... 257/213; 257/324; 257/641; 257/645
[58] Field of Search .................................... 257/635, 641, 257/639, 316, 324, 315, 411, 401, 213, 645, 651

[56] References Cited

U.S. PATENT DOCUMENTS

| | | | |
|---|---|---|---|
| 5,034,798 | 7/1991 | Ohsima | 257/639 |
| 5,053,840 | 10/1991 | Yoshikawa | 257/324 |
| 5,172,200 | 12/1992 | Muragishi et al. | 257/315 |
| 5,297,082 | 3/1994 | Lee | 257/316 |
| 5,468,987 | 11/1995 | Yamazaki et al. | 257/412 |
| 5,625,212 | 4/1997 | Fukumoto | 257/316 |
| 5,734,188 | 3/1989 | Murata et al. | 257/401 |
| 5,864,172 | 1/1999 | Kapoor et al. | 257/634 |
| 5,929,479 | 7/1999 | Oyama | 257/315 |

*Primary Examiner*—Donald L. Monin, Jr.
*Attorney, Agent, or Firm*—Christie, Parker & Hale, LLP

[57] ABSTRACT

A structure of a memory cell in a memory device is taking an interface between a silicon nitride layer and a oxide layer. The memory cell includes: a polysilicon layer on a substrate, a silicon nitride layer on the polysilicon layer, an oxide layer on the silicon nitride layer, and a conductor layer on the oxide layer. The order of forming the silicon nitride layer and the oxide layer can be reversed either for another alternative structure of the memory cell.

16 Claims, 2 Drawing Sheets

STRUCTURE OF A MEMORY CELL

CROSS-REFERENCE TO RELATED APPLICATION

This application claims the priority benefit of Taiwan application serial no. 87104159, filed Mar. 20, 1998, the full disclosure of which is incorporated herein by reference.

BACKGROUND OF THE INVENTION

1. Field of the Invention

This invention relates to a structure of a memory cell in the memory device, and particularly to memory cell using the variation of the resistance in a polysilicon to store the logic state.

2. Description of Related Art

In the storage of the digital information, the memory capability of a memory device is usually described in a unit of "bit". For a memory device, each unit for storing the data is called a "cell", which conventionally is equivalent to a bit. A memory device has a huge number of memory cells, wherein each memory cell has its own address uniquely. These memory cells are arranged in an array of matrix corresponding to the one coordinate in two indices such as (column, row). Those memory cells have the same column number are interconnected together by one distinct interconnection column line separately. It's similar that those memory cells with the same row number are interconnected together by one distinct interconnection row line.

The memory device is one of semiconductor devices for storing the information or data, and, depending on the functions, is divided into two types: one is read-only-memory (ROM) and the other one is random-access-memory (RAM). The information stored by a ROM would not lost when the power was off but the information stored by a RAM would lost when power was off. Therefore the RAM is a kind of volatile memory.

A RAM is further divided into a static RAM (SRAM) and a dynamic RAM (DRAM). A SRAM is utilizing the conducting properties of the transistors inside the SRAM to store the information, wherein the memory cell is typically composed of six transistors.

Referring to FIG. 1, the FIG. 1 illustrates the configuration of a circuit of a SRAM, which includes two N-channel metal-oxide-semiconductor (NMOS) transistors 100, 102 in depletion mode for the purpose of load, two NMOS transistors 104, 106 in enhancement mode for activating, and two NMOS transistors 108, 110 in enhancement mode for access to the information stored in SRAM. For the transistors 108 and 110, their gates are interconnected by a word line 112 in row sequence, their sources are interconnected by a bit line 114, and their drains are interconnected to the gates of transistor 106 and 104 respectively, in which the sources are grounded together and the drains have been coupled to the transistors 102 and 100 respectively. Therefore the state of "on" or "off" for transistors 104 and 106 is closely related to the switching state of transistors 108 and 110. The drains of the access transistors 104 and 106 are interconnected to the world line voltage source 116.

For both SRAM and ROM, typically, either the switch of the voltage state between high and low on the bit line and word line or the selection of a transistor are used to determine whether the signal is at state of input or output.

SUMMARY OF THE INVENTION

It is therefore an objective of this present invention to provide a structure of a memory cell not only having both functions of input and output as usual but also having a function as a control switch achieved by utilizing an interface between a silicon nitride layer and an oxide layer to trap the electrons and change a resistance of a polysilicon being covered by these layers.

In accordance with the foregoing and other objectives of the invention, a memory cell provided by the invention has a structure in which a polysilicon layer is formed on a substrate and then a silicon nitride layer, an oxide layer and a conductor layer are formed over the polysilicon layer, sequentially.

In the foregoing, the memory cell further can have a structure in which a polysilicon layer is formed on a substrate and then an oxide layer, a silicon nitride layer and a conductor layer are formed over the polysilicon layer, sequentially.

In conclusion, the invention allows the memory cell not only having both functions of input and output but also having a function as a control switch achieved by utilizing an interface between a silicon nitride layer and an oxide layer to trap the electrons and change a resistance of a polysilicon being covered by these layers.

BRIEF DESCRIPTION OF DRAWINGS

The invention can be more fully understood by reading the following detailed description of the preferred embodiment, with reference made to the accompanying drawings, wherein.

DETAILED DESCRIPTION OF PREFERRED EMBODIMENT

Figure 1:
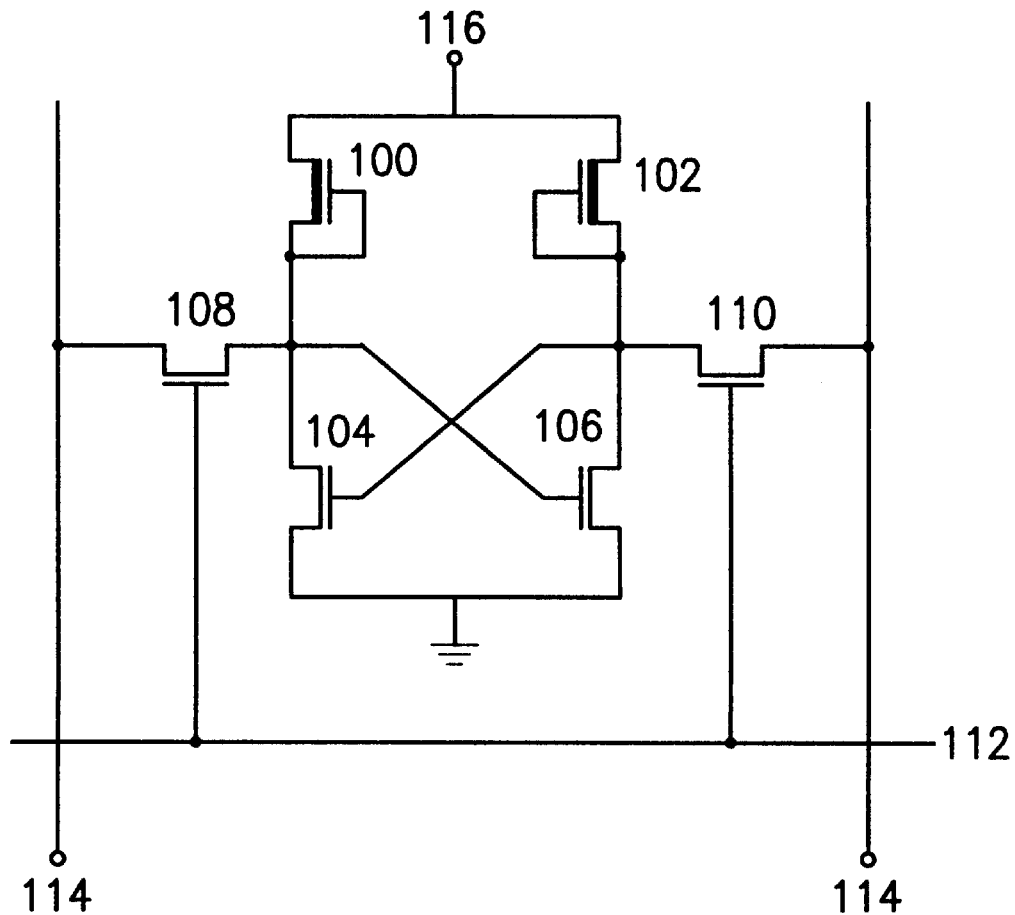
FIG. 1 illustrates the configuration of a circuit of a SRAM.
Figure 2:
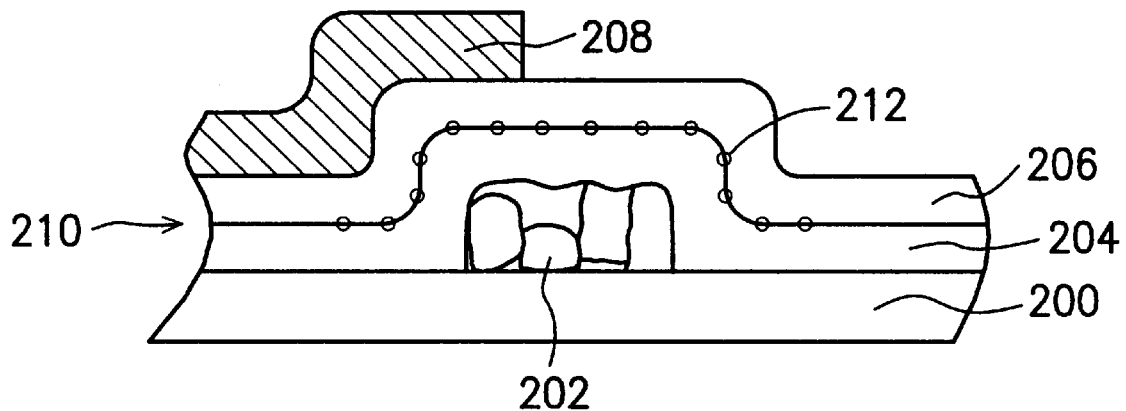
FIG. 2 illustrates the microscopically sectional view of a structure of a memory cell according to the preferred embodiment of the invention.

FIG. 2 illustrates the microscopically sectional view of a structure of a memory cell according to the preferred embodiment of the invention. Referring to FIG. 2, a substrate 200 has a polysilicon 202 on it, which is an intrinsic polysilicon without a dopant or with a little dopant but having vary high resistance. Then a silicon nitride layer 204 and an oxide layer 206 is formed sequentially over the polysilicon 202. Then a conductor layer 208 such as a metal layer or a polysilicon layer with a dopant has covered on the top.

Due to the material characteristics of the silicon nitride layer 204 and the oxide layer 206, an interface 210 between these two layers can easily trap electrons 212, which creates an electric field to stabilize the grain boundary surface of the intrinsic polysilicon 202. Therefore, the electrons from an external source can easily flow through the intrinsic polysilicon 202. This reduces the resistance on the polysilicon, called as poly-resistance. On the contrary, If one lets the electrons inside the interface layer 210 flow out then the intrinsic polysilicon 202 returns back to having many dangling Si bonds inside around the grains, which can trap the passing electrons from the external source. The characteristics of trapping electrons reduces the mobility of the electrons inside the intrinsic polysilicon 202 and thus increases the resistance.

The resistance of polysilicon produced by the structure as described above has a large range, in which the ratio of a high resistance to a low resistance can reach about $10^6$. This ratio allows the polysilicon layer to act as a memory cell. For example, when a negative voltage with respect to the intrinsic polysilicon 202 is applied on the conductor layer 208, then, electrons induced by the voltage source are ejected from the surface of the conductor layer 208 to the intrinsic polysilicon 202. Some electrons 212 can, therefore, be trapped at an interface between the nitride layer 204 and the oxide layer 206 and stay in the interface after the voltage is turned off. Those trapped electrons 212 can generate an electric field to bond the dangling Si bonds on the grain boundary of the intrinsic polysilicon 202 so that the resistance is reduced and therefore the memory cell of this invention is characterized as an "open" state. On the contrary, when a positive voltage is applied on the conductor layer 208 with respect to the intrinsic polysilicon 202, the electrons inside the intrinsic polysilicon 202, then, flow out to the conductor layer 208. The dangling Si bonds around the intrinsic polysilicon grains, thereby, go back to unsaturated state. Therefore, the resistance of the intrinsic polysilicon 202 goes back to a normally high value which characterizes the memory cell as a "close" state.

Figure 3:
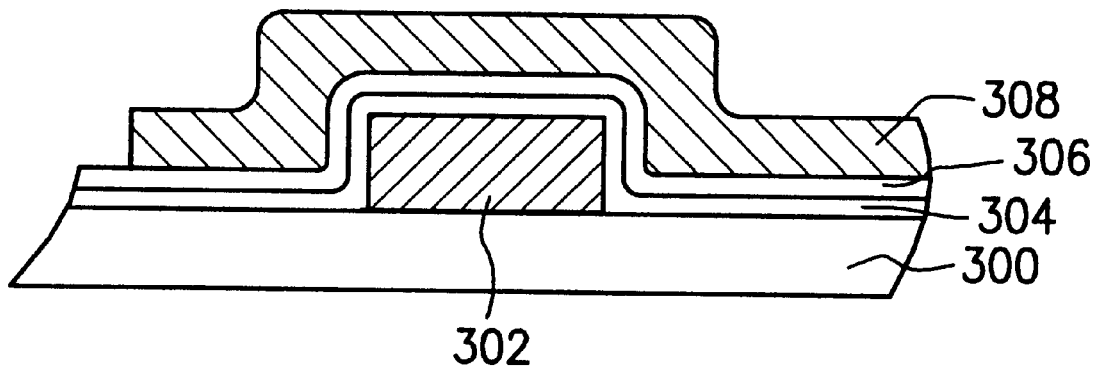
FIG. 3 illustrates the sectional view of a structure of a memory cell according to the preferred embodiment of the invention.

FIG. 3 illustrates the sectional view of the structure of the memory cell according to the preferred embodiment of the invention, wherein the memory cell comprises: a polysilicon layer 302 being formed over a substrate 300, an oxide layer 304, which, for example, can be a native oxide layer, being formed over the polysilicon layer 302, a silicon nitride layer 306 being formed over the oxide layer 304, and then a conductor layer 308 being formed over the silicon nitride layer 306. The oxide layer 304 can be made of, for example, a native oxide, an oxide material by heating process, or an oxide material formed through a Chemical Vapor Deposition (CVD) method with a preferred thickness about between 10 and 50 Angstrom. The silicon nitride layer 306 preferably has thickness about between 20 and 100 Angstrom. The conductor layer 308 can be made of, for example, a material of polysilicon or metal with a proper thickness preferred not too thick to allow the electron being able to flow through.

Figure 4:
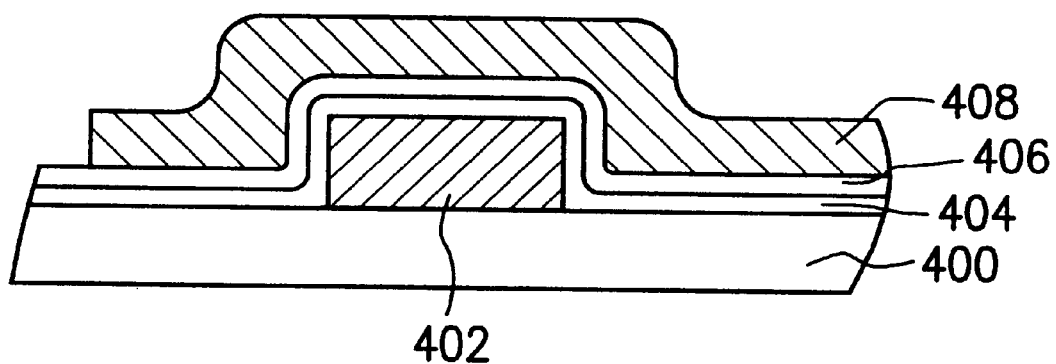
FIG. 4 illustrates the sectional view of another structure of a memory cell according to the preferred embodiment of the invention.

FIG. 4 illustrates the sectional view of another structure of a memory cell according to the preferred embodiment of the invention, wherein the memory cell comprises: a polysilicon layer 402 being formed over a substrate 400, an silicon nitride layer 404 being formed over the polysilicon layer 402, a oxide layer 406 being formed over the silicon nitride layer 404 through a heating process, and then a conductor layer 408 being formed over the oxide layer 406. The silicon nitride layer 404 preferably has a thickness about between 20 and 100 Angstrom. The oxide layer 406 preferably has thickness about between 10 and 50 Angstrom. The conductor layer 408 preferably has a proper thickness not too thick so that the electron is able to flow through.

The invention has been described using exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A structure of a memory cell forming on a substrate, comprising:
   an undoped polysilicon layer, wherein the undoped polysilicon is on the substrate;
   a silicon nitride layer, wherein the silicon nitride layer covers the undoped polysilicon;
   an oxide layer, wherein the oxide layer covers the silicon nitride layer; and
   a conductive layer, wherein the conductive layer covers the oxide layer.

2. The structure of a memory cell of claim 1, wherein the silicon nitride layer has a thickness about between 20 and 100 Angstrom.

3. The structure of a memory cell of claim 1, wherein the oxide layer has a thickness about between 10 and 50 Angstrom.

4. The structure of a memory cell of claim 1, wherein the polysilicon is undoped.

5. The structure of a memory cell of claim 1, wherein the conductive layer further comprises a polysilicon layer.

6. The structure of a memory cell of claim 5, wherein the polysilicon layer comprises a dopant.

7. The structure of a memory cell of claim 1, wherein the conductive layer further comprises a metal layer.

8. The structure of a memory cell of claim 1, wherein the oxide layer further comprises a native oxide layer.

9. A structure of a memory cell forming on a substrate, comprising;
   an undoped polysilicon layer, wherein the undoped polysilicon is on the substrate;
   an oxide layer, wherein the oxide layer covers the undoped polysilicon layer;
   a silicon nitride layer, wherein the silicon nitride layer covers the oxide layer; and
   a conductor layer, wherein the conductor covers silicon nitride layer.

10. The structure of a memory cell of claim 9, wherein the silicon nitride layer has a thickness about between 20 and 100 Angstrom.

11. The structure of a memory cell of claim 9, wherein the oxide layer has a thickness about between 10 and 50 Angstrom.

12. The structure of a memory cell of claim 9, wherein the polysilicon is undoped.

13. The structure of a memory cell of claim 9, wherein the conductor layer further comprises a polysilicon layer.

14. The structure of a memory cell of claim 13, wherein the polysilicon layer includes a dopant.

15. The structure of a memory cell of claim 9, wherein the conductor layer further comprises a metal layer.

16. A structure of a memory cell forming on a substrate, wherein the memory cell is a control switch achieved by utilizing an interface between a silicon nitride layer and an oxide layer to trap a plurality of electrons and change resistance of an undoped polysilicon layer, the structure comprising:
   an undoped polysilicon layer on a substrate;
   a silicon nitride layer on the undoped polysilicon;
   an oxide layer on the silicon nitride layer; and
   a conductive layer on the oxide layer.

* * * * *